(12) United States Patent
Iida et al.

(10) Patent No.: US 11,426,801 B2
(45) Date of Patent: Aug. 30, 2022

(54) CUTTING TOOL

(71) Applicant: Sumitomo Electric Hardmetal Corp., Itami (JP)

(72) Inventors: Momoko Iida, Itami (JP); Makoto Setoyama, Itami (JP); Haruyo Fukui, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 53 days.

(21) Appl. No.: 17/262,751

(22) PCT Filed: Jul. 16, 2020

(86) PCT No.: PCT/JP2020/027615
§ 371 (c)(1),
(2) Date: Jan. 25, 2021

(87) PCT Pub. No.: WO2021/024737
PCT Pub. Date: Feb. 11, 2021

(65) Prior Publication Data
US 2021/0213539 A1  Jul. 15, 2021

(30) Foreign Application Priority Data
Aug. 6, 2019 (JP) .............................. JP2019-144612

(51) Int. Cl.
B23B 27/14 (2006.01)
C23C 14/06 (2006.01)

(52) U.S. Cl.
CPC ........ B23B 27/148 (2013.01); C23C 14/0641 (2013.01); B23B 2224/24 (2013.01); B23B 2228/105 (2013.01)

(58) Field of Classification Search
CPC .... B23B 27/14; B23B 27/148; B23B 2224/24
(Continued)

(56) References Cited

U.S. PATENT DOCUMENTS 5,853,873 A    12/1998  Kukino et al.
2013/0022420 A1*  1/2013  Waki ..................... C23C 30/005
                                                                407/115
(Continued)

FOREIGN PATENT DOCUMENTS

JP    8-119774 A    5/1996
JP    2006-26814 A  2/2006
(Continued)

Primary Examiner — Archene A Turner
(74) Attorney, Agent, or Firm — Xsensus LLP

(57) ABSTRACT

A cutting tool comprises a rake face and a flank face, the cutting tool being composed of a substrate made of a cubic boron nitride sintered material and a coating provided on the substrate, the coating including a MAlN layer, the MAlN layer including crystal grains of $M_xAl_{1-x}N$ in the cubic crystal system, $n_F < n_R$ being satisfied, where $n_F$ represents a number of voids per 100 μm in length of the MAlN layer on the flank face in a cross section of the MAlN layer, and $n_R$ represents a number of voids per 100 μm in length of the MAlN layer on the rake face in a cross section of the MAlN layer, $n_D$ being 3 or less, where $n_D$ represents a number of droplets per 100 μm in length of the MAlN layer on the flank face in a cross section of the MAlN layer.

9 Claims, 5 Drawing Sheets

(58) Field of Classification Search
USPC .......................................... 428/697, 698, 699
See application file for complete search history.

(56) References Cited

U.S. PATENT DOCUMENTS

2013/0071620 A1* 3/2013 Waki .................. C23C 14/0664
428/148
2014/0271000 A1* 9/2014 Sakamoto ............... C23C 28/42
407/119

FOREIGN PATENT DOCUMENTS

| JP | 2008-106287 A | 5/2008 |
| JP | 2018-51748 A | 4/2018 |
| JP | 2018-144139 A | 9/2018 |

* cited by examiner

CUTTING TOOL

CROSS-REFERENCE TO RELATED APPLICATIONS

The present application is based on PCT filing PCT/JP2020/027615, filed Jul. 16, 2020, which claims priority to JP 2019-144612, filed Aug. 6, 2019, the entire contents of each are incorporated herein by reference.

TECHNICAL FIELD

The present disclosure relates to a cutting tool.

BACKGROUND ART

Cubic boron nitride (hereinafter also referred to as "cBN") has a hardness second to that of diamond, and is also excellent in thermal stability and chemical stability. In addition, cBN is more stable for iron-based materials than diamond is, and a cBN sintered material has been used as cutting tools for processing iron-based materials.

Further, in order to enhance a cutting tool made of a cBN sintered material in wear resistance and the like, it has been studied to provide a coating on a substrate of the cBN sintered material.

CITATION LIST

Patent Literature

PTL 1: Japanese Patent Application Laid-Open No. 08-119774

SUMMARY OF INVENTION

The presently disclosed cutting tool is a cutting tool comprising a rake face and a flank face, the cutting tool being composed of a substrate made of a cubic boron nitride sintered material and a coating provided on the substrate, the cubic boron nitride sintered material including cubic boron nitride, the coating including a MAlN layer, in the MAlN layer, M representing a metal element including titanium, chromium, or both, the MAlN layer including crystal grains of $M_xAl_{1-x}N$ in the cubic crystal system, in the $M_xAl_{1-x}N$, the metal element M having an atomic ratio x of 0.3 or more and 0.7 or less, the cubic boron nitride being contained at a ratio of 20% by volume or more with respect to the cubic boron nitride sintered material, $n_F<n_R$ being satisfied, where $n_F$ represents a number of voids per 100 µm in length of the MAlN layer on the flank face in a cross section of the MAlN layer obtained when the MAlN layer is cut along a plane including a normal to the flank face, and $n_R$ represents a number of voids per 100 µm in length of the MAlN layer on the rake face in a cross section of the MAlN layer obtained when the MAlN layer is cut along a plane including a normal to the rake face, $n_D$ being 3 or less, where $n_D$ represents a number of droplets per 100 µm in length of the MAlN layer on the flank face in a cross section of the MAlN layer obtained when the MAlN layer is cut along a plane including a normal to the flank face.

DETAILED DESCRIPTION

Figure 1:
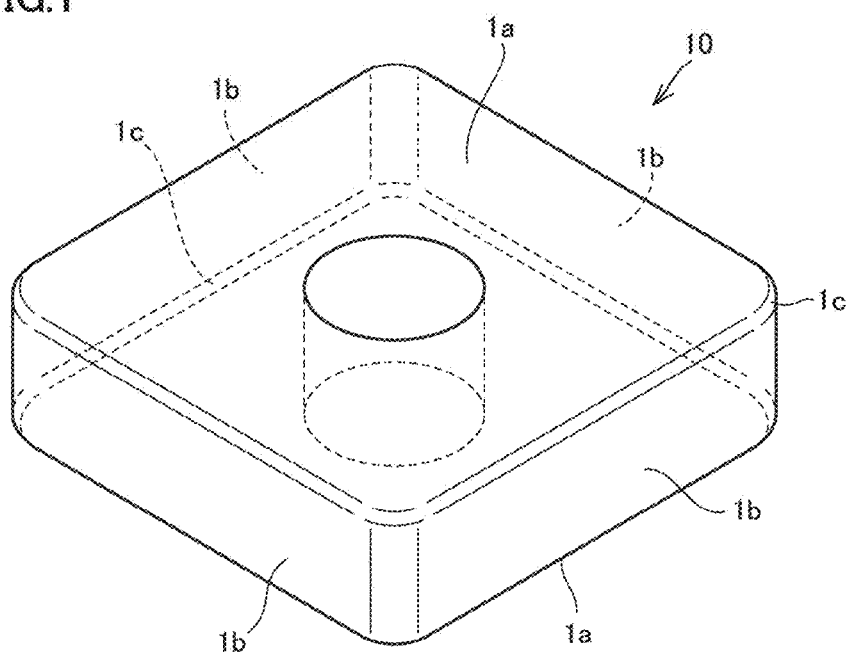
FIG. 1 is a perspective view of a cutting tool according to one embodiment in one manner.

Problem to be Solved by the Present Disclosure

For example, Japanese Patent Laying-Open No. 08-119774 (PTL 1) discloses a composite high-hardness material for a tool having a substrate made of a CBN sintered material including 20% by volume or more of cubic boron nitride or a substrate made of a diamond sintered material including 40% or more of diamond, characterized in that at least one layer of hard heat-resistant coating containing at least one element selected from C, N and O, Ti, and Al as main components is provided at least at a portion involved in cutting. Further, PTL 1 discloses that the hard heat-resistant coating is formed in a conventional physical vapor deposition (PVD) method such as ion plating.

However, the hard heat-resistant coating in the composite high-hardness material for a tool described in PTL 1 includes droplets, and the hard heat-resistant coating may be peeled off due to the droplets during a cutting process. Therefore, further improvement in performance (e.g., wear resistance, peeling resistance, etc.) is required when applied to highly efficient cutting (e.g., cutting with a high feed rate).

The present disclosure has been made in view of the above circumstances, and an object thereof is to provide a cutting tool excellent in wear resistance and peeling resistance.

Advantageous Effect of the Present Disclosure

According to the present disclosure, a cutting tool excellent in wear resistance and peeling resistance can be provided.

Description of Embodiments of the Present Disclosure

Initially, embodiments of the present disclosure will be listed and described.

[1] The presently disclosed cutting tool is a cutting tool comprising a rake face and a flank face, the cutting tool being composed of a substrate made of a cubic boron nitride sintered material and a coating provided on the substrate, the cubic boron nitride sintered material including cubic boron nitride, the coating including a MAlN layer, in the MAlN layer, M representing a metal element including titanium, chromium, or both, the MAlN layer including crystal grains of $M_xAl_{1-x}N$ in the cubic crystal system, in the $M_xAl_{1-x}N$, the metal element M having an atomic ratio x of 0.3 or more and 0.7 or less, the cubic boron nitride being contained at a ratio of 20% by volume or more with respect to the cubic boron nitride sintered material, $n_F < n_R$ being satisfied, where $n_F$ represents a number of voids per 100 μm in length of the MAlN layer on the flank face in a cross section of the MAlN layer obtained when the MAlN layer is cut along a plane including a normal to the flank face, and $n_R$ represents a number of voids per 100 μm in length of the MAlN layer on the rake face in a cross section of the MAlN layer obtained when the MAlN layer is cut along a plane including a normal to the rake face, $n_D$ being 3 or less, where $n_D$ represents a number of droplets per 100 μm in length of the MAlN layer on the flank face in a cross section of the MAlN layer obtained when the MAlN layer is cut along a plane including a normal to the flank face.

In the present cutting tool, the MAlN layer has the number $n_F$ of voids in the flank face to be smaller than the number $n_R$ of voids in the rake face.

Peeling of the coating and chipping of the coating on the flank and rake faces manifest as wear of the coating on the flank face (i.e., flank wear) along with abrasive wear of the flank face. The voids present in the rake face absorb a force (or impact) exerted by chips substantially parallel to the surface of a film, and therefore effectively suppress peeling of the coating and chipping of the coating that manifest in flank wear. Abrasive wear on the flank face is not repeated as compared with an impact on the rake face, and on the flank face, an impact due to abrasive wear is larger than that from chips. Therefore, the flank face is required to have a film structure with fewer voids to suppress flank wear caused by abrasive wear. As a result of extensive studies on these physical properties, it has been found that flank wear resistance (peeling resistance, chipping resistance, and wear resistance) is best obtained when the MAlN layer satisfies $n_F < n_R$. That is, by having the above-described configuration, the cutting tool can be excellent in wear resistance and peeling resistance. Note that herein "peeling resistance" means resistance against peeling of the MAlN layer off the substrate.

[2] The metal element M preferably further includes at least one element selected from the group consisting of boron, silicon, vanadium, zirconium, niobium, molybdenum, hafnium, tantalum, and tungsten. Such a definition allows the cutting tool to be further excellent in wear resistance, and excellent in heat resistance and lubricity.

[3] The $n_R$ is preferably 30 or less. Such a definition allows the cutting tool to he further excellent in peeling resistance.

[4] Preferably, the cutting tool further comprises a cutting edge face connecting the rake face and the flank face together, and $n_F < n_C < n_R$ is satisfied, where $n_C$ represents a number of voids per 100 μm in length of the MAlN layer on the cutting edge face in a cross section of the MAlN layer obtained when the MAlN layer is cut along a plane including a normal to the cutting edge face. Such a definition allows the cutting tool to be further excellent in peeling resistance.

[5] Preferably, the $n_F$ is less than 10, the $n_R$ is less than 30, and the $n_C$ is less than 20. Such a definition allows the cutting tool to absorb an impact of an excessive load exerted from a workpiece or chips while enduring abrasive wear at the flank face during a cutting process.

[6] Preferably, the $n_F$ is less than four, and the $n_C$ is less than five. Such a definition allows the cutting tool to be further excellent in wear resistance and peeling resistance.

[7] Preferably, when the cubic boron nitride has an average grain diameter of R μm, $n_F < 100/R$ is satisfied. Such a definition allows the cutting tool to be further excellent in peeling resistance.

[8] the MAlN layer preferably has a thickness of 0.05 μm or more and 10 μm or less. Such a definition allows the cutting tool to be further excellent in wear resistance and peeling resistance.

[9] The coating preferably has a thickness of 0.5 μm or more and 10 μm or less. Such a definition allows the cutting tool to be further excellent in wear resistance.

Detailed Description of Embodiments of the Present Disclosure

Hereinafter, an embodiment of the present disclosure (hereinafter also referred to as "the present embodiment") will be described. It should be noted, however, that the present embodiment is not exclusive. In the present specification, an expression in the form of "A to Z" means a range's upper and lower limits (that is, A or more and Z or less), and when A is not accompanied by any unit and Z is alone accompanied by a unit, A has the same unit as Z. Further, in the present specification, when a compound is represented by a chemical formula with its constituent elements' compositional ratio unspecified, such as "TiN," the chemical formula shall encompass any conventionally known compositional ratio (or elemental ratio). The chemical formula shall include not only a stoichiometric composition but also a nonstoichiometric composition. For example, the chemical formula of "TiN" includes not only a stoichiometric composition of "$Ti_1N_1$" but also a non-stoichiometric composition for example of "$Ti_1N_{0.8}$." This also applies to descriptions for compounds other than "TiN."

<<Surface-Coated Cutting Tool>>

The presently disclosed cutting tool is a cutting tool comprising a rake face and a flank face, the cutting tool being composed of a substrate made of a cubic boron nitride sintered material and a coating provided on the substrate, the cubic boron nitride sintered material including cubic boron nitride, the coating including a MAlN layer, in the MAlN layer, M representing a metal element including titanium, chromium, or both, the MAlN layer including crystal grains of $M_xAl_{1-x}N$ in the cubic crystal system, in the $M_xAl_{1-x}N$, the metal element M having an atomic ratio x of 0.3 or more and 0.7 or less, the cubic boron nitride being contained at a ratio of 20% by volume or more with respect to the cubic boron nitride sintered material, $n_F < n_R$ being satisfied, where $n_F$ represents a number of voids per 100 μm in length of the MAlN layer on the flank face in a cross section of the MAlN layer obtained when the MAlN layer is cut along a plane including a normal to the flank face, and $n_R$ represents a number of voids per 100 μm in length of the MAlN layer on the rake face in a cross section of the MAlN layer obtained when the MAlN layer is cut along a plane including a normal to the rake face, $n_D$ being 3 or less, where $n_D$ represents a number of droplets per 100 μm in length of the MAlN layer on the flank face in a cross section of the MAlN layer obtained when the MAlN layer is cut along a plane including a normal to the flank face.

The surface coated cutting tool according to the present embodiment (hereinafter also simply referred to as a "cutting tool") can for example be a drill, an end mill, an indexable cutting insert for a drill, an indexable cutting insert for an end mill, an indexable cutting insert for milling, an indexable cutting insert for turning, a metal saw, a gear cutting tool, a reamer, a tap, or the like.

FIG. 1 is a perspective view of a cutting tool according to one embodiment in one manner. A cutting tool 10 having such a shape is used as an indexable cutting insert for turning.

Cutting tool 10 shown in FIG. 1 has a surface including a top surface, a bottom surface, and four side surfaces, and is generally in the form of a quadrangular prism which is more or less smaller in thickness in the vertical direction. Further, cutting tool 10 has a throughhole penetrating it through the top and bottom surfaces, and the four side surfaces at their boundary portions have adjacent ones thereof connected by an arcuate surface.

Cutting tool 10 normally has the top and bottom surfaces to form a rake face 1a, the four side surfaces (and each arcuate surface connecting adjacent ones thereof together) to form a flank face 1b, and a surface connecting rake face 1a and flank face 1b together to form a cutting edge face 1c. A "rake face" means a face ejecting chips produced from a workpiece as it is cut. A "flank face" means a face partially brought into contact with the workpiece. The cutting edge face is included in a portion configuring the cutting edge of the cutting tool.

When the cutting tool is an indexable cutting insert, cutting tool 10 also includes a shape with or without a chip breaker. While FIG. 1 shows the cutting tool having a cutting edge shaped to be a flat surface (i.e., cutting edge face 1c), the cutting edge's shape is not limited thereto. That is, the cutting edge has a shape including that of a sharp edge (that is, a ridge formed by the rake face and the flank face) (see FIG. 3 for example) and that of a negative land (that is, a chamfered shape) (see FIG. 2 for example).

While the shape of cutting tool 10 and the name of each part thereof have been described with reference to FIG. 1, similar terminology will be used to indicate a shape of the substrate of cutting tool 10 according to the present embodiment and the name of each part thereof that correspond to those of cutting tool 10. That is, the substrate of the cutting tool has a rake face and a flank face. The substrate may have a cutting edge face connecting the rake face and the flank face together.

Figure 4:
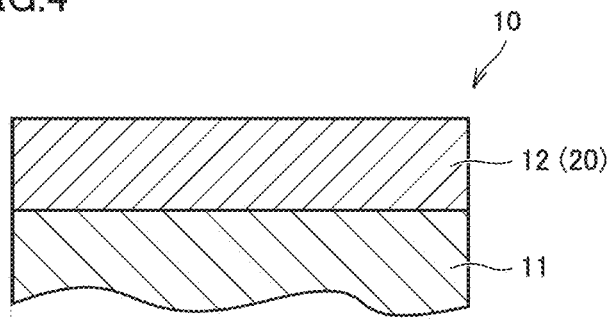
FIG. 4 is a schematic cross section of a cutting tool according to the present embodiment in another manner.

Cutting tool 10 comprises a substrate 11 and an MAlN layer 12 provided on substrate 11 (see FIG. 4). In addition to MAlN layer 12, cutting tool 10 may further include an underlying layer 13 provided between substrate 11 and MAlN layer 12 (see FIG. 5). Cutting tool 10 may further include a surface layer 14 provided on MAlN layer 12 (see FIG. 5). Other layers such as underlying layer 13 and surface layer 14 will be described hereinafter.

Figure 2:
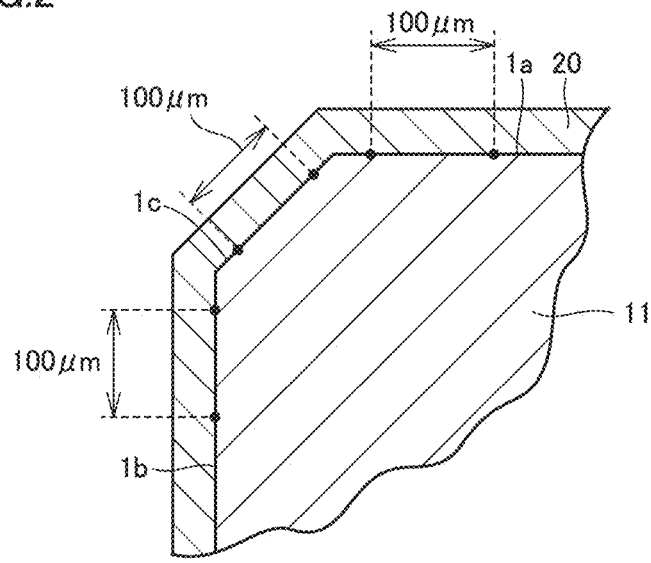
FIG. 2 is a schematic cross section of a cutting tool according to the present embodiment in one manner.
Figure 3:
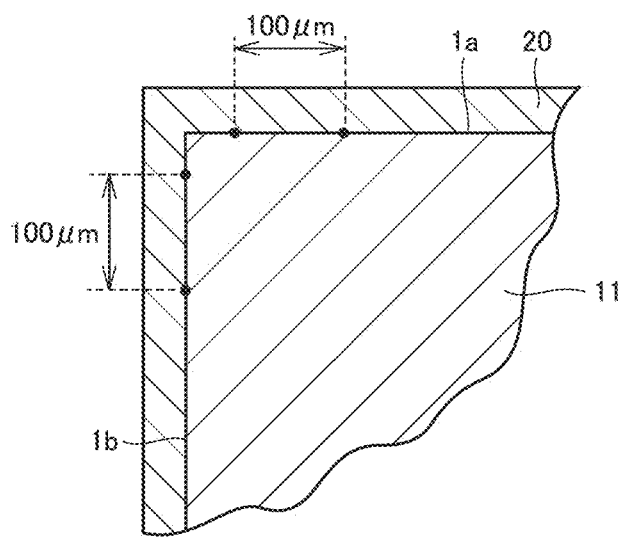
FIG. 3 is a schematic cross section of a cutting tool according to the present embodiment in another manner.
Figure 5:
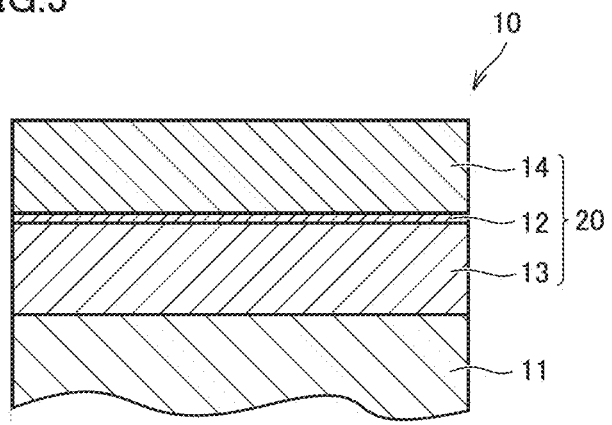
FIG. 5 is a schematic cross section of a cutting tool according to the present embodiment in another manner.

The above-described layers provided on the substrate may be collectively referred to as a "coating." That is, cutting tool 10 comprises a coating 20 coating substrate 11 (see FIGS. 2 and 3). Coating 20 includes MAlN layer 12 (see FIG. 4). Further, coating 20 may further include underlying layer 13 or surface layer 14 (FIG. 5).

<Substrate>
<<Cubic Boron Nitride Sintered Material>>

The substrate of the present embodiment is made of a cubic boron nitride (cBN) sintered material. The cubic boron nitride sintered material includes cubic boron nitride. In one aspect of the present embodiment, the cubic boron nitride sintered material preferably further includes a binder.

(Cubic Boron Nitride)

In the present embodiment, "cubic boron nitride" means crystal grains of cubic boron nitride in the cubic crystal system. That is, the cubic boron nitride sintered material includes polycrystalline cubic boron nitride.

The cubic boron nitride preferably has an average grain diameter R of 0.5 µm or more and 8 µm or less, more preferably 1 µm or more and 5 µm or less.

Average grain diameter R can be determined by a cutting method using a scanning electron microscope (SEM). Specifically, initially, any surface or cross section of the cubic boron nitride sintered material is mirror-finished. Subsequently, the processed surface of the cubic boron nitride sintered material is observed with an SEM at a magnification of 5,000 to 100,000 times to obtain an SEM image.

Subsequently, a circle is drawn in the SEM image, and eight straight lines are drawn radially from the center of the circle (such that each straight line and another straight line form a substantially equal intersection angle) to the circle's circumference. In doing so, the magnification for the observation and the diameter of the circle are preferably set such that approximately 10 to 50 cubic boron nitride (crystal grains) are seen per straight line.

Subsequently, how many grain boundaries of the cubic boron nitride are traversed is counted for each straight line and the length of the straight line is divided by the number of traversed grain boundaries to obtain an average segmental length. Finally, the average segmental length is multiplied by 1.128 to obtain a numerical value, which serves as the average grain diameter of the cubic boron nitride (Note that this method is pursuant to a method for calculating a nominal grain diameter according to the ASTM standard.). Note that such an average drain diameter is suitably such that more preferably, several SEM images are used to obtain an average grain diameter for each image in the above method and an average value of such average grain diameters thus obtained serves as the average grain diameter of the cubic boron nitride. A measurement in such a method as described above has a possibility of including a grain diameter of grains other than cubic boron nitride (for example, crystal grains of wurtzite type boron nitride), and even when another grain's grain diameter is thus included, it is also included in determining an average grain diameter of the cubic boron nitride.

The cubic boron nitride is contained relative to the cubic boron nitride sintered material at a ratio of 20% by volume or more, preferably 20% by volume or more and 97% by volume or less, more preferably 20% by volume or more and 80% by volume or less. The ratio of the cubic boron nitride contained is determined by capturing an image of a sample of the cubic boron nitride sintered material, in a cross section as described above, with an SEM, and analyzing the captured image. That is, it can be calculated by identifying crystal grains of cubic boron nitride in a predetermined field of view, performing image-processing to calculate a sum in area of the identified crystal grains, and dividing the sum by the area of the field of view. Furthermore, it is preferable that the same cubic boron nitride sintered material undergo the above image analysis in a plurality of fields of view (for example, five or more fields of view) and an average value thereof be determined as the ratio of the cubic boron nitride contained. For the above image processing, an image analysis type particle size distribution analysis software ("MacView" manufactured by Mauntec Co., Ltd.) can be suitably used. The "predetermined field of view" may be the same as the field of view used in obtaining an average grain diameter of crystal grains of the cubic boron nitride, as has been described above.

While the ratio obtained in the above-described method is a ratio in area of the cubic boron nitride in a field of view, in the present embodiment the ratio is regarded as a ratio in volume and thus handled. That is, when the cubic boron nitride has a ratio in area of 20% as determined in the above method, the cubic boron nitride will be regarded as being contained at a ratio of 20% by volume with respect to the cubic boron nitride sintered material.

(Binder)

In the present embodiment, a "binder" means a substance that binds crystal grains of the cubic boron nitride together. The binder preferably includes a compound consisting of: at least one element selected from the group consisting of a group 4 element, a group 5 element and a group 6 element of the periodic table of elements, Al (aluminum), and Si (silicon); and at least one element selected from the group consisting of C (carbon), N (nitrogen), B (boron) and O (oxygen).

Examples of the group 4 element for example include Ti (titanium), Zr (zirconium), and Hf (hafnium). Examples of the group 5 element for example include V (vanadium), Nb (niobium), and Ta (tantalum). Examples of the group 6 element for example include Cr (chromium), Mo (molybdenum), and W (tungsten). The binder's each component can be determined by analyzing a region of a sample of the cutting tool including the above-described cross section that corresponds to the binder through energy dispersive x-ray spectroscopy accompanying an SEM (SEM-EDX). This is done by observing the sample at a magnification for example of 10,000 times.

Examples of the compound consisting of: at least one element selected from the group consisting of a group 4 element, a group 5 element and a group 6 element of the periodic table of elements, Al, and Si; and at least one element selected from the group consisting of C, N, B and O include a nitride such as TiN and AlN, a carbide such as TiC and WC, a boride such as $TiB_2$ and $AlB_2$, an oxide such as $Al_2O_3$ and the like, or TiCN, AlON, SiAlON, SiTiAlON and the like.

(Inevitable Impurities)

The cubic boron nitride sintered material may include inevitable impurities within a range that does not impair an effect that the present disclosure has. Inevitable impurities collectively refer to elements and compounds that may be contained in a trace amount in raw materials for the cubic boron nitride sintered material or in producing it. Elements and compounds contained as inevitable impurities are each contained in an amount (in % by volume) of 0% by volume or more and 5% by volume or less, and a total of these (that is, a total content of trace impurities) is 0% by volume or more and 5% by volume or less. Therefore, inevitable impurities may or may not be contained in the cubic boron nitride sintered material. Examples of inevitable impurities include Li, Mg, Ca, Sr, Ba, Be, Si, Ga, La, Fe, and Cu.

<Coating>

The coating according to the present embodiment includes a MAlN layer. In the MAlN layer, M represents a metal element including titanium, chromium, or both. The "coating" coats at least a portion of the substrate (for example, a portion of the rake face and a portion of the flank face) to exhibit a function to improve the cutting tool's various characteristics such as breaking resistance, wear resistance and the like. The coating preferably coats the entire surface of the substrate. However, even if the substrate is partially uncoated with the coating or the coating is partially different in configuration, such does not depart from the scope of the present embodiment.

The coating preferably has a thickness of 0.5 μm or more and 10 μm or less, more preferably 1 μm or more and 5 μm or less. Note that the thickness of the coating means a total thickness of any layers constituting the coating. A "layer constituting the coating" for example includes the MAlN layer, an intermediate layer, which will be described hereinafter, the underlying and surface layers described above, and other like layers. For example, the thickness of the coating can be determined by measuring any 10 points in a cross-sectional sample of the coating parallel to the direction of a normal to a surface of the substrate with an SEM, and calculating an average value in thickness of the measured 10 points. The measurement is done at a magnification for example of 10,000 times. The same applies when measuring in thickness the MAlN layer, the intermediate layer, the underlying and surface layers, and the like. The SEM is JSM-7600F (trade name) and JSM-7800 (trade name) manufactured by JEOL Ltd., for example.

(MAlN Layer)

The MAlN layer includes crystal grains of $M_xAl_{1-x}N$ in the cubic crystal system. That is, the MAlN layer is a layer including polycrystalline $M_xAl_{1-x}N$. The cubic $M_xAl_{1-x}N$ crystal grains are identified for example by a pattern of a diffraction peak obtained through x-ray diffraction.

In the MAlN layer, M represents a metal element. The metal element M includes titanium, chromium, or both. In one aspect of the present embodiment, the metal element M preferably further includes at least one element selected from the group consisting of boron, silicon, vanadium, zirconium, niobium, molybdenum, hafnium, tantalum, and tungsten (hereinafter also referred to as a "third element"). While boron is normally considered as a semimetal that exhibits an intermediate property between a metallic element and a nonmetallic element, for the MAlN layer of the present embodiment, an element having free electron is regarded as a metal, and boron shall be included in the range of metallic elements.

In one aspect of the present embodiment, the metal element M is preferably titanium. That is, preferably, the coating includes a TiAlN layer as the MAlN layer, and the TiAlN layer includes crystal grains of $Ti_xAl_{1-x}N$ in the cubic crystal system. Note that the TiAlN layer is a layer including polycrystalline $Ti_xAl_{1-x}N$. The cubic $Ti_xAl_{1-x}N$ crystal grains are identified for example by a pattern of a diffraction peak obtained through x-ray diffraction.

In the $M_xAl_{1-x}N$, the metal element M preferably has an atomic ratio x of 0.3 or more and 0.7 or less, preferably 0.32 or more and 0.55 or less. The x can be determined by subjecting the above-described cross-sectional sample to energy dispersive x-ray spectroscopy accompanying an SEM (SEM-EDX) to subject the MAlN layer entirely to an elemental analysis. This is done by observing the sample at a magnification for example of 5,000 times. Specifically, any 10 points in the MAlN layer in the cross-sectional sample is each measured to obtain a value of the x, and an average value of such values obtained at the 10 points is defined as x in the MAlN layer. Note that when the metal element M includes a plurality of metal elements, a sum of the atomic ratios of the metal elements will be the atomic ratio x of the metal element M. Further, "any 10 points" are selected from different crystal grains of the MAlN layer. The EDX device is JED-2300 (trade name) manufactured by JEOL Ltd., for example.

When the metal element M includes titanium, the titanium in the $M_xAl_{1-x}N$ has an atomic ratio w preferably of larger than 0 and 0.7 or less, more preferably 0.32 or more and 0.55 or less. Note that when the metal atom M is titanium alone, the atomic ratio x of the metal element M matches the atomic ratio w of titanium as a matter of course.

When the metal element M includes chromium, the chromium in the $M_xAl_{1-x}N$ has an atomic ratio y preferably of larger than 0 and 0.7 or less, more preferably 0.05 or more and 0.3 or less. Note that when the metal atom M is chromium alone, the atomic ratio x of the metal element M matches the atomic ratio y of chromium as a matter of course.

When the metal element M includes the third element, the third element in the $M_xAl_{1-x}N$ has an atomic ratio z preferably of larger than 0 and 0.7 or less, more preferably 0.01 or more and 0.4 or less. Note that when the third element includes a plurality of metal elements, a sum of the atomic ratios of the metal elements will be the atomic ratio z of the third element.

The MAlN layer preferably has a thickness of 0.05 μm or more and 10 μm or less, more preferably 1 μm or more and 5 μm or less. When the MAlN layer forms a multilayer structure described hereinafter, the thickness of the MAlN layer means a thickness per layer. The thickness can be measured for example by observing such a cross section as described above of the cutting tool with an SEM at a magnification of 10,000 times.

The MAlN layer may be included in the coating as a single MAlN layer or a plurality of (e.g., 2 to 50) MAlN layers. The MAlN layer may form a multilayer structure in which the MAlN layer and another layer, such as an intermediate layer described hereinafter, are stacked alternately. In one aspect of the present embodiment, the MAlN layer may per se form a multilayer structure.

(Number of Voids in the MAlN Layer)

In the present embodiment, when the number of voids per 100 μm in length of the MAlN layer on the flank face in a cross section of the MAlN layer obtained when the MAlN layer is cut along a plane including a normal to the flank face is represented as $n_F$, and the number of voids per 100 μm in length of the MAlN layer on the rake face in a cross section of the MAlN layer obtained when the MAlN layer is cut along a plane including a normal to the rake face is represented as $n_R$, $n_F<n_R$ is satisfied.

In the present embodiment, a "void" means a linear gap having a length of 0.5 μm or more. The void preferably extends in the direction of the thickness of the coating.

Figure 6:
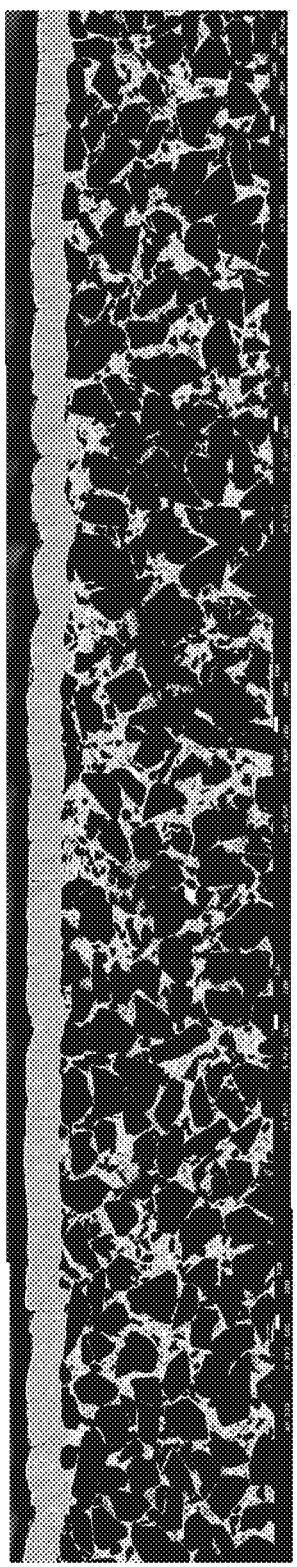
FIG. 6 is an enlarged SEM image of a cross section of the cutting tool according to the present embodiment.
Figure 7:
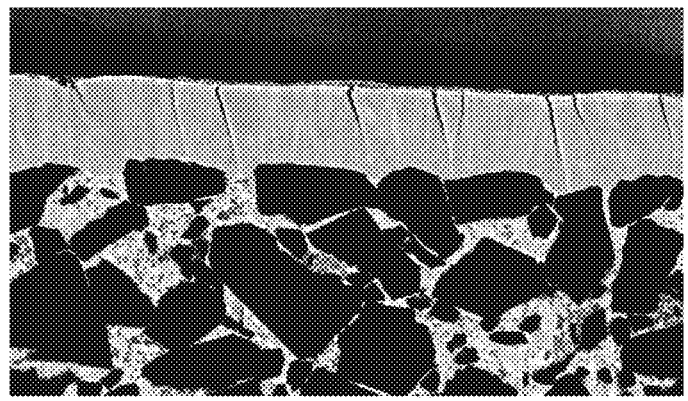
FIG. 7 is an enlarged SEM image of a cross section of the cutting tool according to the present embodiment.

The number of voids is counted through the following procedure: Initially, such a cross section as described above of the cutting tool is observed with a SEM at a magnification of 5,000 times to obtain an SEM image. In doing so, the SEM image is obtained so that the MAlN layer is continuously included in a range of a length of 100 μm (a length in a direction perpendicular to the direction of the thickness of the MAlN layer). The number of SEM images to be obtained is not particularly limited insofar as the MAlN layer is included in the range of the length of 100 μm, and it may be one field of view or a plurality of fields of view. When SEM images are obtained in a plurality of fields of view, the SEM images may initially be joined together (see FIG. 6 for example) and the number of voids described hereinafter may be counted subsequently. One field of view may have a size for example of 25 μm×20 μm, The obtained SEM image is visually confirmed, and the number of voids in the range continuously having the length of 100 μm is counted. The present inventors consider that the number of voids is a parameter reflecting a property of the entire MAlN layer. In the present embodiment, a gap having a length of less than 0.5 μm is not counted as a void even if it has a linear shape. Further, a gap which is round or similarly non-linear in shape is not counted as a void, either. Whether a void may or may not penetrate the MAlN layer of interest, the void is counted as one void. For example, in the SEM image shown in FIG. 7, a thin gray layer is the MAlN layer, and a black linear crack in the layer is a void. In FIG. 7, nine voids are counted.

As will be described hereinafter, it is believed that a void is generated such that it starts from a surface of the substrate, and the present inventors consider that a void observed in the SEM image of the cross-sectional sample to be generated from a middle of the MAlN layer is in reality generated from a surface of the substrate and only observed at an intermediate portion of the void.

The number of such voids is counted in the "range continuously having the length of 100 μm" at at least three locations and an average value thereof serves as the number of voids in the MAlN layer.

In principle, the above void counting method is applied to all of the flank face, the rake face, and the cutting edge face (see FIGS. 2 and 3 for example). Note, however, that when the "range continuously having the length of 100 μm" is not ensured at the cutting edge face or the like, the number of voids is determined by counting the number of voids in a range of a maximum length that can be ensured, and converting the number of voids thus counted into that of voids per 100 μm in length. For example, when a range of a maximum length that can be ensured is 20 μm, then, the number of voids per 100 μm in length is calculated by counting the number of voids in the range of the length of 20 μm and multiplying the counted number of voids by 5.

Preferably, when the cubic boron nitride's crystal grains have an average grain diameter of R μm, $n_F<100/R$ is satisfied.

Preferably, when the cutting tool according to the present embodiment further comprises a cutting edge face connecting the rake face and the flank face together, and the number of voids per 100 μm in length of the MAlN layer on the cutting edge face in a cross section of the MAlN layer obtained when the MAlN layer is cut along a plane including a normal to the cutting edge face is represented as $n_C$, $n_F<n_C<n_R$ is satisfied.

The $n_F$ is preferably 10 or less, more preferably less than 10, and still more preferably less than 4. When the MAlN layer on the flank face has a predetermined number of voids, stress attributed to contact with a workpiece during a cutting process is alleviated, and shearing and peeling of the MAlN layer is suppressed. On the other hand, the presence of voids in the flank face reduces wear resistance against abrasive wear added during a cutting process, and flank wear may progress. That is, the MAlN layer on the flank face that has a predetermined number of voids allows enhancement in peeling resistance and wear resistance.

The $n_R$ is preferably 30 or less, more preferably less than 30, still more preferably 1 or more and less than 30. As the MAlN layer on the rake face has a predetermined number of voids, stress attributed to contact with chips during a cutting process is alleviated, and shearing and peeling of the MAlN layer is suppressed. That is, the MAlN layer on the rake face that has a predetermined number of voids allows enhancement in peeling resistance.

The $n_C$ is preferably 20 or less, more preferably less than 20, still more preferably less than 5, still more preferably 1 or more and less than 5. As the MAlN layer on the cutting edge face has a predetermined number of voids, stress attributed to contact with a workpiece during a cutting process is alleviated, and shearing and peeling of the MAlN layer is suppressed. That is, the MAlN layer on the cutting edge face that has a predetermined number of voids allows enhancement in peeling resistance.

In one aspect of the present embodiment, preferably, the $n_F$ is less than 10, the $n_R$ is less than 30, and the $n_C$ is less than 20.

In another aspect of the present embodiment, preferably, the $n_F$ is less than 4 and the $n_C$ is less than 5.

When a plurality of MAlN layers are included in the coating, at least one of the plurality of MAlN layers satisfying the above-indicated condition for the number of voids suffices. This is because it is believed that an effect of the present disclosure is effected in that MAlN layer.

(Number of Droplets in the MAlN Layer)

In the present embodiment, a number $n_D$ of droplets per 100 µm in length of the MAlN layer on the flank face in a cross section of the MAlN layer obtained when the MAlN layer is cut along a plane including a normal to the flank face, is 3 or less, preferably 0 or more and 2 or less.

Figure 8:
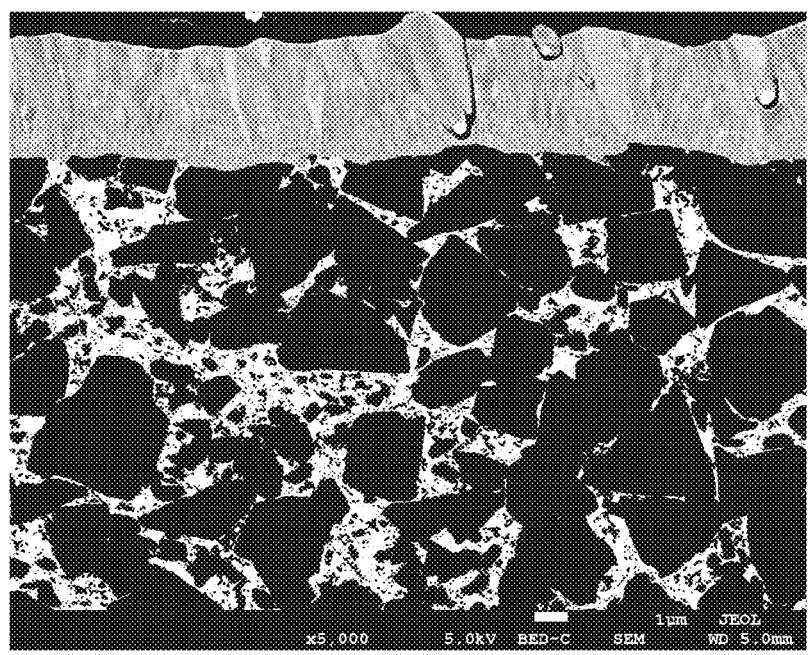
FIG. 8 is an enlarged SEM image of a cross section of a cutting tool of a comparative example.

In the present embodiment, a "droplet" means a grain of metal that is present in a layer configuring the coating (for example, the MAlN layer such as a Ti AlN layer) and has a predetermined size as will be described hereinafter. The number of droplets is counted in the same method as the method for counting the number of voids as described above. That is, the above-described cross section of the cutting tool is observed with an SEM at a magnification of 5,000 times to obtain an SEM image. In doing so, the SEM image is obtained so that the MAlN layer is continuously included in a range of a length of 100 µm. The obtained SEM image is visually confirmed, and a white, generally round portion present in the MAlN layer (for example, in a layer indicated in light gray in FIG. 8) is noted. Subsequently, a rectangle circumscribing the generally round portion is drawn, and a length $L_a$ (in µm) of the longer side of the rectangle and a length $L_b$ (in µm) of the shorter side of the rectangle are determined. Note that the rectangle is set such that the longer side or the shorter side is parallel to a major surface of the substrate. In the present embodiment, being "parallel" is an idea which is not limited to being geometrically parallel and also includes being generally parallel. The generally round portion is counted as a droplet when the obtained $L_a$ and $L_b$ satisfy the following condition:

$$0.75 < L_b/L_a \leq 1, \text{ and } 0.1 < L_a.$$

The number of such droplets is counted in a "range continuously having a length of 100 µm" at at least three locations and an average value thereof serves as the number of droplets in the MAlN layer.

(Another Layer)

Insofar as an effect which the present embodiment has is not impaired, the coating may further include another layer. Examples of the other layer include an underlying layer provided between the substrate and the MAlN layer and a surface layer provided on the MAlN layer, and an intermediate layer provided between the underlying layer and the MAlN layer or between the MAlN layer and the surface layer. The underlying, surface, and intermediate layers may have their respective compositions identically or differently insofar as the layers are distinguishable from the MAlN layer. The underlying layer may for example be a layer composed of a compound represented by TiN. The surface layer may for example be a layer composed of a compound represented by CrN. The intermediate layer may for example be a layer composed of a compound represented by AlCrN. While the other layer is not particularly limited in thickness insofar as it does not impair an effect of the present embodiment, it has a thickness for example of 0.1 µm or more and 2 µm or less.

<<Method for Manufacturing a Surface-Coated Cutting Tool=

A method for manufacturing a cutting tool according to the present embodiment comprises:

preparing the substrate (hereinafter also referred to as a "first step"); and forming the MAlN layer on the substrate by high-power impulse magnetron sputtering (hereinafter also simply referred to as a "second step").

High-power impulse magnetron sputtering (HiPIMS) is a type of sputtering. In contrast to normal sputtering, HiPIMS is a deposition method in which power is applied in a pulsed manner and atoms of a target (or a raw material) repelled by discharge are deposited on a substrate or the like.

In HiPIMS, the substrate is set in an apparatus and a target is set as a cathode, and a negative voltage is subsequently applied to the target to cause discharge. In doing so, the apparatus is internally vacuumed and filled with an inert gas (for example, Ar gas). The inert gas in the apparatus is ionized by the discharge, and ions of the inert gas collide with a surface of the target at high speed. This collision repels atoms of the target and thus deposits them on the substrate to form a coating.

Since HiPIMS provides deposition on the principle described above, it is less likely to generate droplets than arc cathode ion plating. Further, the present inventors consider that depositing the MAlN layer such as a TiAlN layer on the substrate of a cubic boron nitride sintered material through HiPIMS allows the voids to be formed from a surface of the substrate. Thus, it is believed that the voids are attributed to the type of the substrate and how deposition is provided, and the present inventors consider that such voids are also generated when a layer other than the MAlN layer (for example, the underlying layer, the intermediate layer, and the like) is formed.

<First Step: Step of Preparing the Substrate>

In the first step, a substrate is prepared. As the substrate, a substrate made of the above-described cubic boron nitride sintered material is prepared. The substrate may be a commercially available substrate. The substrate may be produced in a method described below in an example. Subsequently, the cubic boron nitride sintered material can be chamfered or subjected to a prescribed process for a cutting edge to prepare a substrate made of the cubic boron nitride sintered material.

<Second Step: Step of Forming the MAlN Layer>

In the second step, the MAlN layer is formed on the substrate by high-power impulse magnetron sputtering. The method for example uses a target of the metal element M (e.g., Ti) and Al adjusted in amount depending on the composition of the MAlN layer to be formed.

For example, the second step can be performed as follows: Initially, a chip having a shape as desired is attached as a substrate in a chamber of a deposition apparatus. In doing so, it is disposed such that the substrate has the flank face to face the target. For example, the substrate is attached to a substrate holder set on a rotary table rotatably provided at the center in the chamber of the deposition apparatus. A bias power supply is connected to the substrate holder. Ar gas and nitrogen gas are introduced while the rotary table is rotated at the center in the chamber. Further, sputtering power (for example having an average power of 10 kW, a frequency of 2,000 Hz, and a pulse width of 100 µs) is applied to the target for forming the MAlN layer while maintaining the substrate at a temperature of 500 to 800° C., a reactant gas at a pressure at 500 mPa to 1,000 mPa and the bias power source to have a voltage in a range of −200 to 20 V. This repels metal atoms from the target for forming the MAlN layer, and once a predetermined period of time has elapsed, applying the sputtering power is stopped, and the MAlN layer is formed on a surface of the substrate. In doing so, the deposition time is adjusted to allow the MAlN layer to have a thickness falling within a predetermined range. In the second step, the MAlN layer may be formed on a portion involved in a cutting process (e.g., rake and flank faces in a vicinity of the cutting edge), and in addition thereto, on a surface of the substrate other than the portion involved in the cutting process.

(Raw Material for MAlN Layer)

In the second step, the MAlN layer is formed of a material including the metal element M and Al. When the MAlN layer is a TiAlN layer, a raw material for the TiAlN layer includes Ti and Al. A raw material for the TiAlN layer is for example a powdery sintered alloy of Ti and Al.

In the present embodiment, the reactant gas is appropriately set depending on the composition of the MAlN layer. The reactant gas includes nitrogen gas and an inert gas for example.

In one aspect of the present embodiment, the substrate may have a surface etched before the MAlN layer is deposited. The etching is performed for example under the following conditions:

Etching Conditions
Inert gas: Ar gas
Temperature: 500° C.
Pressure: 350 mPa
Voltage: pulsed DC voltage (of 500V, with frequency: 200 kHz)
Etching time: 10 min.

<Another Step>

In the manufacturing method according to the present embodiment, in addition to the above-described steps, the step of forming an underlying layer on the substrate, the step of forming an intermediate layer on the underlying layer or the MAlN layer, the step of forming a surface layer on the MAlN layer, the step of surface treatment, and the like may be performed as appropriate. When another layer, such as the underlying, intermediate, surface, and other layers, is formed, the other layer may be formed in a conventional method. Specifically, for example, the other layer may be formed through physical vapor deposition (PVD) different from HiPIMS. The step of surface treatment includes a surface treatment using a medium with an elastic material carrying powdery diamond, for example.

What has been described above includes features indicated in the following additional notes.

(Additional Note 1)

A surface-coated cutting tool comprising a rake face and a flank face, the surface-coated cutting tool being composed of a substrate made of a cubic boron nitride sintered material and a coating provided on the substrate, the cubic boron nitride sintered material including cubic boron nitride, the coating including a TiAlN layer, the TiAlN layer including cubic $Ti_xAl_{1-x}N$ crystal grains, in the $Ti_xAl_{1-x}N$, Ti having an atomic ratio x of 0.3 or more and 0.7 or less, the cubic boron nitride being contained at a ratio of 20% by volume or more with respect to the cubic boron nitride sintered material, $n_F < n_R$ being satisfied, where $n_F$ represents a number of voids per 100 µm in length of the TiAlN layer on the flank face in a cross section of the TiAlN layer obtained when the TiAlN layer is cut along a plane including a normal to the flank face, and $n_R$ represents a number of voids per 100 µm in length of the TiAlN layer on the rake face in a cross section of the TiAlN layer obtained when the TiAlN layer is cut along a plane including a normal to the rake face, $n_D$ being 3 or less, where $n_D$ represents a number of droplets per 100 µm in length of the TiAlN layer on the flank face in a cross section of the TiAlN layer obtained when the TiAlN layer is cut along a plane including a normal to the flank face.

(Additional Note 2)

The surface-coated cutting tool according to additional note 1, wherein the $n_R$ is 30 or less.

(Additional Note 3)

The surface-coated cutting tool according to additional note 1 or 2, further comprising a cutting edge face connecting the rake face and the flank face together, wherein when the number of voids per 100 µm in length of the TiAlN layer on the cutting edge face in a cross section of the TiAlN layer obtained when the TiAlN layer is cut along a plane including a normal to the cutting edge face is represented as $n_C$, $n_F < n_C < n_R$ is satisfied.

(Additional Note 4)

The surface-coated cutting tool according to additional note 3, wherein the $n_F$ is less than 10, the $n_R$ is less than 30, and the $n_C$ is less than 20.

(Additional Note 5)

The surface-coated cutting tool according to additional note 3 or 4, wherein the $n_F$ is less than 4 and the $n_C$ is less than 5.

(Additional Note 6)

The surface-coated cutting tool according to any one of additional notes 1 to 5, wherein when the cubic boron nitride has an average grain diameter of R µm, $n_F < 100/R$ is satisfied.

(Additional Note 7)

The surface-coated cutting tool according to any one of additional notes 1 to 6, wherein the TiAlN layer has a thickness of 0.05 µm or more and 10 µm or less.

(Additional Note 8)

The surface-coated cutting tool according to any one of additional notes 1 to 7, wherein the coating has a thickness of 0.5 µm or more and 10 µm or less.

EXAMPLES

Hereinafter, the present invention will more specifically be described with reference to examples although the present invention is not limited thereto.

[Experiment 1]

<<Manufacturing a Cutting Tool>>

<First Step: Preparing a Substrate>

Initially, TiN, Ti and Al as a binder were mixed using a pot made of a cemented carbide and a ball made of a cemented carbide to obtain a powdery raw material for the binder.

Subsequently, the powdery raw material for the binder and powdery cubic boron nitride (powdery cBN) were mixed to obtain a powdery mixture. The obtained powdery mixture was introduced into a container. The powdery mixture introduced in the container was sintered for 20 minutes at a temperature of 1400° C. under a pressure of 5 GPa to obtain a cubic boron nitride sintered material. The obtained cubic boron nitride sintered material was processed into a shape of DNGA150408 according to the ISO standard to obtain a substrate of the cubic boron nitride sintered material.

<Depositing the Coating>
(Second Step: Depositing TiAlN Layer)

On the substrate of the cubic boron nitride sintered material obtained in the first step, a TiAlN layer as the MAIN layer was formed through HiPIMS. That is, a plurality of targets were disposed in a deposition apparatus and the substrate was attached to a rotary auxiliary jig provided for the substrate at the center of these targets, and deposition is done through the following procedure.

Initially, the deposition apparatus was internally vacuumed to 3 mPa, and subsequently heated to around 500° C. Subsequently, Ar gas was introduced. Subsequently, a pulsing DC voltage of 500 V (frequency: 200 kHz) was applied to the substrate in an atmosphere of 350 mPa to generate a plasma of Ar to etch a surface of the substrate (for 10 minutes).

Subsequently, Ar gas and $N_2$ gas were introduced into the deposition apparatus and adjusted to provide a total pressure of 500 mPa (partial pressure: Ar: 350 mPa, and $N_2$: 150 mPa). Subsequently, a bias voltage of −50 V was applied to the substrate and sputtering power (average power: 12 kW, frequency: 3,000 Hz, pulse width: 100 µs) was applied to a cathode (a target metal which is a sintered alloy of Ti and Al) to sputter the target metal to form a TiAlN layer. The atomic ratio of Ti and that of Al in the TiAlN layer were adjusted by varying the ratio of Ti and that of Al in the target metal. The TiAlN layer was adjusted in thickness by deposition time. Cutting tools for sample Nos. 1 to 31 were thus fabricated.

For sample No. 14, instead of HiPIMS, conventional arc cathode ion plating was employed to form the TiAlN layer on the substrate.

(Depositing an Underlying Layer and a Surface Layer)

For sample Nos. 26 to 31, HiPIMS was employed to form an underlying layer between the substrate of the cubic boron nitride sintered material and the TiAlN layer. Table 2 shows the underlying layer's composition and thickness.

Further, for sample Nos. 26 to 31, conventional sputtering was employed to form a surface layer on the TiAlN layer.

Table 2 shows the surface layer's composition and thickness. In Table 2, and Tables 1, 3 and 4, which will be described hereinafter, a matter of an item indicated across a plurality of samples means that it is identical for the plurality of samples. For example, in Table 2, sample Nos. 26 to 31 indicate that they all have an underlying layer composed of TiN.

<<Evaluating Characteristics of Cutting Tools>>

Using the cutting tools of sample Nos. 1 to 31 manufactured as described above, the cutting tools' characteristics were evaluated as follows:

<Average Grain Diameter of Cubic Boron Nitride>

Average grain diameter R of the cubic boron nitride in the cubic boron nitride sintered material was determined in the above-described cutting method using a scanning electron microscope (SEM). A result thereof is shown in Tables 1 and 2.

<Ratio of Cubic Boron Nitride Contained>

The ratio of the cubic boron nitride contained in the cubic boron nitride sintered material was determined in the method described above. That is, an image of a sample of the cubic boron nitride sintered material in a cross section as described above was captured with an SEM and analyzed. A result thereof is shown in Tables 1 and 2.

<Measuring Thickness of Each Layer Configuring the Coating>

The coating's constituent layers (i.e., the underlying, TiAlN and surface layers) are each measured in thickness by measuring any 10 points in a sample of the coating in a cross section parallel to the direction of a normal to a surface of the substrate with an SEM (manufactured by JEOL Ltd., trade name: JEM-2100F), and calculating an average value of the measured 10 points in thickness. This was done by observing the sample at a magnification of 10,000 times. A result thereof is shown in Tables 1 and 2.

<Measuring Atomic Ratio x of Ti in $Ti_xAl_{1-x}N$>

The atomic ratio x of Ti in $Ti_xAl_{1-x}N$ was determined in the method described above. Specifically, any 10 points in the TiAlN layer in the above-described cross-sectional sample is each measured with an SEM-EDX device to obtain a value of the x, and an average value of such values obtained at the 10 points is defined as x in the $Ti_xAl_{1-x}N$ layer. A result thereof is shown in Tables 1 and 2.

<Measuring Composition of Underlying Layer and Composition of Surface Layer>

The underlying and surface layers' respective compositions were determined by observing the above-described cross-sectional sample with the SEM-EDX device to analyze the entirety of a layer to be analyzed. A result is shown in Table 2.

TABLE 1

| samples | substrate of cBN sintered material | | underlying layer | | TiAlN layer | | surface layer | | coating's total |
|---|---|---|---|---|---|---|---|---|---|
| | average grain diameter R of cBN (µm) | ratio of cBN contained (vol %) | composition | thickness (µm) | atomic ratio x of Ti in $Ti_xAl_{1-x}N$ | thickness (µm) | composition | thickness (µm) | thickness (µm) |
| 1 | 3 | 60 | none | — | 0.5 | 3 | none | — | 3 |
| 2 | | | | | | | | | |
| 3 | | | | | | | | | |
| 4 | | | | | | | | | |
| 5 | | | | | | | | | |
| 6 | | | | | | | | | |

TABLE 1-continued

| samples | substrate of cBN sintered material | | underlying layer | | TiAlN layer | | surface layer | | coating's total |
|---|---|---|---|---|---|---|---|---|---|
| | average grain diameter R of cBN (μm) | ratio of cBN contained (vol %) | composition | thickness (μm) | atomic ratio x of Ti in $Ti_xAl_{1-x}N$ | thickness (μm) | composition | thickness (μm) | thickness (μm) |
| 7 | 4 | 70 | none | — | 0.2 | 2.5 | none | — | 2.5 |
| 8 | | | | | 0.35 | | | | |
| 9 | | | | | 0.5 | | | | |
| 10 | | | | | 0.65 | | | | |
| 11 | | | | | 0.75 | | | | |
| 12 | 4 | 70 | none | — | 0.52 | 2.5 | none | — | 2.5 |
| 13 | | | | | | | | | |
| 14 | | | | | | | | | |
| 15 | 3 | 60 | none | — | 0.5 | 2.5 | none | — | 2.5 |
| 16 | | | | | | | | | |
| 17 | | | | | | | | | |
| 18 | | | | | | | | | |
| 19 | | | | | | | | | |
| 20 | | | | | | | | | |
| 21 | | | | | | | | | |

TABLE 2

| samples | substrate of cBN sintered material | | underlying layer | | TiAlN layer | | surface layer | | coating's total |
|---|---|---|---|---|---|---|---|---|---|
| | average grain diameter R of cBN (μm) | ratio of cBN contained (vol %) | composition | thickness (μm) | atomic ratio x of Ti in $Ti_xAl_{1-x}N$ | thickness (μm) | composition | thickness (μm) | thickness (μm) |
| 22 | 5 | 70 | none | — | 0.4 | 2.5 | none | — | 2.5 |
| 23 | | | | | | | | | |
| 24 | | | | | | | | | |
| 25 | | | | | | | | | |
| 26 | 5 | 75 | TiN | 0.2 | 0.52 | 0.3 | CrN | 0.2 | 0.43 |
| 27 | | | | | | 0.5 | | | 0.9 |
| 28 | | | | | | 2 | | | 2.4 |
| 29 | | | | | | 5 | | | 5.4 |
| 30 | | | | | | 8 | | | 8.4 |
| 31 | | | | | | 12 | | | 12.4 |

<Determining Number of Voids>

The number of voids per 100 μm in length of the TiAlN layer was determined in the method described above. That is, the above-described cross sectional sample was observed with an SEM at a magnification of 5,000 times to obtain an SEM image. In doing so, the SEM image was obtained so that the TiAlN layer was continuously included in a range of a length of 100 μm. The obtained SEM image was visually confirmed, and the number of voids in the range continuously having the length of 100 μm was counted. The number of voids was counted in each of the flank face, the rake face and the cutting edge face. A result thereof is shown in Tables 3 and 4.

<Determining Number of Droplets>

The number of droplets per 100 μm in length of the TiAlN layer was determined in the method described above. That is, the above-described cross sectional sample was observed with an SEM at a magnification of 5,000 times to obtain an SEM image. In doing so, the SEM image was obtained so that the TiAlN layer was continuously included in a range of a length of 100 μm. The obtained SEM image was visually confirmed, and the number of droplets in the range continuously having the length of 100 μm was counted. A result thereof is shown in Tables 3 and 4.

TABLE 3

| samples | atomic ratio x of Ti in $Ti_xAl_{1-x}N$ | TiAlN layer no. of voids flank face $n_F$ | TiAlN layer no. of voids cutting edge face $n_C$ | TiAlN layer no. of voids rake face $n_R$ | no. of droplets in flank face $n_D$ | cutting test cutting condition | cutting test flank wear in width (μm) |
|---|---|---|---|---|---|---|---|
| 1 | 0.5 | 1 | — | 2 | 0 | cutting test 1 | 25 |
| 2 |  | 3 | — | 22 | 1 |  | 38 |
| 3 |  | 7 | — | 28 | 0 |  | 60 |
| 4 |  | 5 | — | 2 | 0 |  | 106 |
| 5 |  | 35 | — | 14 | 0 |  | 111 |
| 6 |  | 7 | — | 35 | 0 |  | 75 |
| 7 | 0.2 | 3 | — | 8 | 0 | cutting test 2 | 90 |
| 8 | 0.35 | 2 | — | 6 | 1 |  | 40 |
| 9 | 0.5 | 3 | — | 6 | 0 |  | 38 |
| 10 | 0.65 | 4 | — | 9 | 0 |  | 40 |
| 11 | 0.75 | 4 | — | 6 | 0 |  | 95 |
| 12 | 0.52 | 2 | — | 6 | 1 | cutting test 2 | 31 |
| 13 |  | 2 | — | 7 | 3 |  | 45 |
| 14 |  | 1 | — | 5 | 7 |  | 100 |
| 15 | 0.5 | 1 | 4 | 15 | 1 | cutting test 3 | 35 |
| 16 |  | 2 | 12 | 25 | 0 |  | 50 |
| 17 |  | 5 | 20 | 33 | 0 |  | 55 |
| 18 |  | 8 | 30 | 45 | 1 |  | 65 |
| 19 |  | 12 | 35 | 50 | 0 |  | 78 |
| 20 |  | 25 | 40 | 55 | 1 |  | 90 |
| 21 |  | 1 | 25 | 15 | 0 |  | 110 |

TABLE 4

| samples | atomic ratio x of Ti in $Ti_xAl_{1-x}N$ | TiAlN layer no. of voids flank face $n_F$ | TiAlN layer no. of voids cutting edge face $n_C$ | TiAlN layer no. of voids rake face $n_R$ | no. of droplets in flank face $n_D$ | cutting test cutting condition | cutting test flank wear in width (μm) |
|---|---|---|---|---|---|---|---|
| 22 | 0.4 | 2 | 3 | 15 | 0 | cutting test 1 | 29 |
| 23 |  | 17 | 24 | 29 | 0 |  | 55 |
| 24 |  | 22 | 27 | 29 | 1 |  | 86 |
| 25 |  | 25 | 30 | 35 | 1 |  | 90 |
| 26 | 0.52 | 2 | 4 | 15 | 1 | cutting test 4 | 90 |
| 27 |  | 2 | 4 | 13 | 0 |  | 70 |
| 28 |  | 1 | 2 | 10 | 0 |  | 60 |
| 29 |  | 1 | 3 | 18 | 1 |  | 84 |
| 30 |  | 1 | 2 | 18 | 0 |  | 88 |
| 31 |  | 3 | 4 | 16 | 1 |  | 142 |

<<Cutting Test>>

(Cutting Test 1: Turning an External Periphery)

Cutting tools of samples manufactured as described above (Sample Nos. 1 to 6 and 22 to 25) were used under conditions, as indicated below, to shave 650 workpieces each by 1.5 m. Flank wear in a quenched-steel cutting process using cBN-TA (a slow-away turning tool of a cBN sintered material) manifests as peeling, chipping and abrasive wear are composited together, and accordingly, the flank face's wear in width (frank wear in width) was measured. Flank wear in width was used as an index of the rake and flank faces' peeling resistance and the flank face's wear resistance. A result thereof is shown in Tables 3 and 4. A cutting tool having a flank face worn by a width of 100 μm or less was evaluated as a cutting tool excellent in wear resistance and peeling resistance. In this cutting test, sample Nos. 1 to 3, 6, and 22 to 25 correspond to examples. Sample Nos. 4 and 5 correspond to comparative examples.

<Conditions for Cutting Test 1>
Workpiece: SCM415 round bar (HRC61)
Cutting speed: 150 m/min.
Feed rate: 0.2 mm/rev
Cutting Depth: 0.2 mm
Coolant: wet type As can be seen in Table 3, the cutting tools of sample Nos. 1 to 3 and 6 provided a good result, that is, they had their flank faces worn by a width of 75 μm or less. The cutting tools of Sample Nos. 4 and 5 had their flank faces worn by a width of 106 μm or more. From the above results, it has been found that the cutting tools of the examples are excellent in wear resistance and peeling resistance. The smaller the number of voids $n_R$ in the rake face is, the smaller the flank wear in width tends to be.

Further, Table 4 shows that the cutting tools of sample Nos. 22 to 25 provided a good result, that is, they had their flank faces worn by a width of 90 μm or less. Inter alia, it has been confirmed that the cutting tool of sample No. 22 that has an $n_F$ of less than 10, an $n_R$ of less than 30, and an $n_C$ of less than 20 is particularly excellent as it has a flank face worn by a width of 29 μm or less.

(Cutting Test 2: Turning an External Periphery)

Cutting tools of samples manufactured as described above (Sample Nos. 7 to 14) were used wider conditions, as indicated below, to shave a workpiece continuously by 4 km, Thereafter, flank wear in width was measured. A result thereof is shown in Table 3. A cutting tool having a flank face worn by a width of less than 90 μm was evaluated as a cutting tool excellent in wear resistance and peeling resistance. A cutting tool having a flank face worn by a smaller width can be evaluated as a cutting tool excellent in wear resistance and peeling resistance. In this cutting test, sample Nos. 8 to 10, 12 and 13 correspond to examples. Sample Nos. 7, 11 and 14 correspond to comparative examples.

<Conditions for Cutting Test 2>
Workpiece: SCM415 round bar (HRC61)
Cutting speed: 120 m/min.
Feed rate: 0.12 mm/rev
Cutting Depth: 0.2 mm
Coolant: wet type As can be seen in Table 3, the cutting tools of sample Nos. 8 to 10, 12 and 13 provided a good result, that is, they had their flank faces worn by a width of 45 μm or less. The cutting tools of Sample Nos. 7, 11 and 14 had their flank faces worn by a width of 90 μm or more. From the above results, it has been found that the cutting tools of the examples are excellent in wear resistance and peeling resistance.

(Cutting Test 3: Turning an External Periphery)

Cutting tools of samples manufactured as described above (Sample Nos. 15 to 21) were used under conditions, as indicated below, to shave a workpiece continuously by 5 km. Thereafter, flank wear in width was measured. A result thereof is shown in Table 3. A cutting tool having a flank face worn by a width of 110 μm or less was evaluated as a cutting tool excellent in wear resistance and peeling resistance. In this cutting test, sample Nos. 15 to 21 correspond to examples.

<Conditions for Cutting Test 3>
Workpiece: SCM415 round bar (HRC61)
Cutting speed: 150 m/min.
Feed rate: 0.1 mm/rev
Cutting Depth: 0.3 mm
Coolant: dry type As can be seen in Table 3, the cutting tools of sample Nos. 15 to 21 provided a good result, that is, they had their flank faces worn by a width of 110 μm or less. From the above results, it has been found that the cutting tools of the examples are excellent in wear resistance and peeling resistance. Inter alia, it has been found that the cutting tools of sample Nos. 15 to 20 satisfying $n_F<n_C<n_R$ are particularly excellent in wear resistance and peeling resistance.

(Cutting Test 4: Turning an External Periphery)

Cutting tools of samples manufactured as described above (Sample Nos. 26 to 31) were used under conditions, as indicated below, to shave a workpiece continuously by 4 km. Thereafter, flank wear in width was measured. A result thereof is shown in Table 4. A cutting tool having a flank face worn by a width of 145 μm or less was evaluated as a cutting tool excellent in wear resistance and peeling resistance. In this cutting test, sample Nos. 26 to 31 correspond to examples.

<Conditions for Cutting Test 4>
Workpiece: SCM415 round bar (HRC61)
Cutting speed: 200 mm/min.
Feed rate: 0.15 mm/rev
Cutting Depth: 0.3 mm
Coolant: wet type As can be seen in Table 4, the cutting tools of sample Nos. 26 to 31 provided a good result, that is, they had their flank faces worn by a width of 142 μm or less. From the above results, it has been found that the cutting tools of the examples are excellent in wear resistance and peeling resistance. Inter alia, it has been found that the cutting tools of sample Nos. 27 to 30 including a TiAlN layer having a thickness of 0.05 μm or more and 10 μm or less are particularly excellent in wear resistance and peeling resistance (see Tables 2 and 4).

[Experiment 2]

<<Manufacturing a Cutting Tool>>

<First Step: Preparing a Substrate>

The same method as experiment 1 was employed to obtain a substrate of a cubic boron nitride sintered material having a shape of DNGA150408 according to the ISO standard.

<Depositing the Coating>

(Second Step: Depositing the MAlN Layer)

An MAlN layer was formed on the substrate in the same manner as in Experiment 1 except that the target was changed so that the MAlN layer had a composition shown in Table 5. Cutting tools for sample Nos. 32 to 53 were thus fabricated. Note that the cutting tools of sample Nos. 32 to 52 were all configured to comprise a coating without including the underlying layer and the surface layer therein. The cutting tool of sample No. 53 was configured to comprise a coating including an underlying layer of TiN (0.1 μm) and a surface layer of CrN (0.3 μm).

<<Evaluating Characteristics of Cutting Tools>>

Using the cutting tools of sample Nos. 32 to 53 manufactured as described above, the cutting tools' characteristics were evaluated as follows: A result thereof is shown in Tables 5 and 6.

<<Cutting Test>>

Using the cutting tools of sample Nos. 32 to 53 manufactured as described above, cutting tests 1 to 4 were conducted under the same cutting conditions as those in Experiment 1. In Experiment 2, each cutting test was conducted with the following evaluation criteria. In cutting test 1, a cutting tool having a flank face worn by a width of 75 μm or less was evaluated as a cutting tool excellent in wear resistance and peeling resistance. In cutting test 2, a cutting tool having a flank face worn by a width of less than 90 μm was evaluated as a cutting tool excellent in wear resistance and peeling resistance. In cutting test 3, a cutting tool having a flank face worn by a width of 105 μm or less was evaluated as a cutting tool excellent in wear resistance and peeling resistance. In cutting test 4, a cutting tool having a flank face worn by a width of 145 μm or less was evaluated as a cutting tool excellent in wear resistance and peeling resistance. In the cutting tests, sample Nos. 32, 34-39, 41, 43-46, 50, 51 and 53 correspond to examples. Sample Nos. 33, 40, 42, 47 to 49 and 52 correspond to comparative examples. A result is shown in Table 6.

TABLE 5

| | substrate of cBN sintered material | | MAlN layer ($M_xAl_{1-x}N$) | | | | | | coating's |
|---|---|---|---|---|---|---|---|---|---|
| | average grain | ratio of | metal element M | | | | | | |
| samples | diameter R of cBN (μm) | cBN contained (vol. %) | atomic ratio w of Ti | atomic ratio y or Cr | 3rd element | atomic ratio z of 3rd element | atomic ratio x of M in $M_xAl_{1-x}N$ | thickness (μm) | total thickness (μm) |
| 32 | 3 | 65 | 0.45 | 0.1 | B | 0.02 | 0.57 | 2.5 | 2.5 |
| 33 | 3 | 65 | 0.45 | 0.1 | B | 0.02 | 0.57 | 2.5 | 2.5 |
| 34 | 3 | 65 | 0.05 | 0.3 | V | 0.05 | 0.4 | 2.5 | 2.5 |
| 35 | 3 | 65 | 0.3 | 0.3 | Nb | 0.08 | 0.68 | 2.5 | 2.5 |
| 36 | 3 | 65 | 0.5 | 0.05 | Mo | 0.05 | 0.6 | 2.5 | 2.5 |
| 37 | 3 | 65 | 0.5 | 0.05 | Hf | 0.03 | 0.58 | 2.5 | 2.5 |
| 38 | 3 | 65 | 0.5 | 0.05 | Ta | 0.05 | 0.6 | 2.5 | 2.5 |
| 39 | 3 | 65 | 0.5 | 0.05 | W | 0.1 | 0.65 | 2.5 | 2.5 |
| 40 | 3 | 65 | $W_{0.3}Hf_{0.1}Al_{0.6}N$ | | | | | 2.5 | 2.5 |
| 41 | 4 | 70 | 0.3 | — | | 0 | 0.3 | 3.0 | 3 |
| 42 | 4 | 70 | Deposit $Ti_{0.6}Al_{0.4}N$ (0.3 μm) & $Cr_{0.3}Al_{0.7}N$ (0.4 μm) each 4 times | | | | | 2.8 | 2.8 |
| 43 | 4 | 70 | Deposit $Ti_{0.6}Al_{0.35}Si_{0.05}N$ (0.1 μm) & $Cr_{0.5}Al_{0.5}N$ (0.2 μm) each 9 times | | | | | 2.7 | 2.7 |
| 44 | 4 | 70 | Deposit $Ti_{0.5}Al_{0.5}N$ (0.5 μm) & $Cr_{0.2}Al_{0.8}N$ (0.5 μm) each 3 times | | | | | 3.0 | 3 |
| 45 | 5 | 75 | 0.5 | 0.05 | Zr | 0.05 | 0.6 | 5.0 | 5 |
| 46 | 5 | 75 | 0.1 | 0.05 | Zr | 0.5 | 0.65 | 5.0 | 5 |
| 47 | 5 | 75 | 0.5 | 0.25 | Zr | 0.1 | 0.85 | 5.0 | 5 |
| 48 | 5 | 75 | 0.1 | 0.05 | Zr | 0.05 | 0.2 | 5.0 | 5 |
| 49 | 5 | 75 | 0.3 | 0.3 | Zr | 0.2 | 0.8 | 5.0 | 5 |
| 50 | 5 | 75 | 0.3 | 0.05 | Nb | 0.2 | 0.55 | 5.0 | 5 |
| 51 | 5 | 75 | 0.2 | 0.05 | Nb | 0.35 | 0.6 | 5.0 | 5 |
| 52 | 5 | 75 | 0.3 | 0.05 | Nb | 0.5 | 0.85 | 5.0 | 5 |
| 53 | 5 | 75 | 0.4 | 0.15 | Nb | 0.05 | 0.6 | 5.0 | 5.4 |

TABLE 6

| | MAlN layer | | | | cutting test | |
|---|---|---|---|---|---|---|
| | | no. of voids | | no. of | | |
| samples | atomic ratio x of M in $M_xAl_{1-x}N$ | flank face $n_F$ | cutting edge face $n_C$ | rake face $n_R$ | droplets in flank face $n_D$ | cutting condition | flank wear in width (μm) |
| 32 | 0.57 | 1 | 4 | 15 | 1 | cutting test 4 | 52 |
| 33 | 0.57 | 15 | 8 | 1 | 0 | | 178 |
| 34 | 0.4 | 5 | 5 | 18 | 1 | cutting test 1 | 70 |
| 35 | 0.68 | 2 | 4 | 8 | 1 | | 25 |
| 36 | 0.6 | 4 | 8 | 15 | 0 | | 37 |
| 37 | 0.58 | 3 | 4 | 10 | 0 | | 33 |
| 38 | 0.6 | 4 | 8 | 12 | 0 | | 42 |
| 39 | 0.65 | 4 | 5 | 11 | 2 | | 50 |
| 40 | 0 | 2 | 3 | 5 | 1 | | 98 |
| 41 | 0.3 | 3 | 4 | 7 | 0 | cutting test 3 | 67 |
| 42 | 0.43 | 10 | 7 | 2 | 1 | | 108 |
| 43 | 0.55 | 4 | 5 | 8 | 1 | | 50 |
| 44 | 0.35 | 2 | 3 | 12 | 0 | | 44 |
| 45 | 0.6 | 4 | — | 8 | 1 | cutting test 2 | 39 |
| 46 | 0.65 | 10 | — | 12 | 1 | | 51 |
| 47 | 0.85 | 3 | — | 7 | 1 | | 113 |
| 48 | 0.2 | 2 | — | 9 | 0 | | 120 |
| 49 | 0.8 | 6 | — | 12 | 1 | | 131 |
| 50 | 0.55 | 5 | — | 10 | 1 | | 45 |
| 51 | 0.6 | 7 | — | 13 | 2 | | 47 |
| 52 | 0.85 | 6 | — | 9 | 0 | | 141 |
| 53 | 0.6 | 4 | — | 10 | 2 | | 40 |

Table 6 shows that the cutting tools of the examples are excellent in wear resistance and peeling resistance.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST

1$a$ rake face, 1$b$ flank face, 1$c$ cutting edge face, 10 cutting tool, 11 substrate, 12 MAlN layer, 13 underlying layer, 14 surface layer, 20 coating.

The invention claimed is:

1. A cutting tool comprising a rake face and a flank face, the cutting tool being composed of a substrate made of a cubic boron nitride sintered material and a coating provided on the substrate,
the cubic boron nitride sintered material including cubic boron nitride,
the coating including a MAlN layer,
in the MAlN layer, M representing a metal element including titanium, chromium, or both,
the MAlN layer including crystal grains of $M_xAl_{1-x}N$ in the cubic crystal system,
in the $M_xAl_{1-x}N$, the metal element M having an atomic ratio x of 0.3 or more and 0.7 or less,
the cubic boron nitride being contained at a ratio of 20% by volume or more with respect to the cubic boron nitride sintered material,
$n_F<n_R$ being satisfied, where $n_F$ represents a number of voids per 100 μm in length of the MAlN layer on the flank face in a cross section of the MAlN layer obtained when the MAlN layer is cut along a plane including a normal to the flank face, and $n_R$ represents a number of voids per 100 μm in length of the MAlN layer on the rake face in a cross section of the MAlN layer obtained when the MAlN layer is cut along a plane including a normal to the rake face,
$n_D$ being 3 or less, where $n_D$ represents a number of droplets per 100 μm in length of the MAlN layer on the flank face in a cross section of the MAlN layer obtained when the MAlN layer is cut along a plane including a normal to the flank face.

2. The cutting tool according to claim 1, wherein the metal element M further includes at least one element selected from the group consisting of boron, silicon, vanadium, zirconium, niobium, molybdenum, hafnium, tantalum, and tungsten.

3. The cutting tool according to claim 1, wherein the $n_R$ is 30 or less.

4. The cutting tool according to claim 1, further comprising a cutting edge face connecting the rake face and the flank face together, wherein
when a number of voids per 100 μm in length of the MAlN layer on the cutting edge face in a cross section of the MAlN layer obtained when the MAlN layer is cut along a plane including a normal to the cutting edge face is represented as $n_C$, $n_F<n_C<n_R$ is satisfied.

5. The cutting tool according to claim 4, wherein the $n_F$ is less than 10, the $n_R$ is less than 30, and the $n_C$ is less than 20.

6. The cutting tool according to claim 4, wherein the $n_F$ is less than 4 and the $n_C$ is less than 5.

7. The cutting tool according to claim 1, wherein when the cubic boron nitride has an average grain diameter of R μm, $n_F<100/R$ is satisfied.

8. The cutting tool according to claim 1, wherein the MAlN layer has a thickness of 0.05 μm or more and 10 μm or less.

9. The cutting tool according to claim 1, wherein the coating has a thickness of 0.5 μm or more and 10 μm or less.

* * * * *